US010340142B1

United States Patent
Gao et al.

(10) Patent No.: US 10,340,142 B1
(45) Date of Patent: Jul. 2, 2019

(54) METHODS, APPARATUS AND SYSTEM FOR SELF-ALIGNED METAL HARD MASKS

(71) Applicant: GLOBALFOUNDRIES INC., Grand Cayman (KY)

(72) Inventors: Jinsheng Gao, Clifton Parkl, NY (US); Daniel Jaeger, Saratoga Springs, NY (US); Michael Aquilino, Gansevoort, NY (US); Patrick Carpenter, Saratoga Springs, NY (US); Jiehui Shu, Clifton Park, NY (US); Pei Liu, Clifton Park, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/919,119

(22) Filed: Mar. 12, 2018

(51) Int. Cl.
*H01L 21/033* (2006.01)
*H01L 21/311* (2006.01)
*H01L 29/66* (2006.01)
*H01L 21/3213* (2006.01)

(52) U.S. Cl.
CPC ...... *H01L 21/0337* (2013.01); *H01L 21/0332* (2013.01); *H01L 21/0335* (2013.01); *H01L 21/31144* (2013.01); *H01L 21/32139* (2013.01); *H01L 29/6653* (2013.01); *H01L 29/66553* (2013.01)

(58) Field of Classification Search
CPC ............ H01L 21/0337; H01L 21/0332; H01L 21/0335; H01L 21/31144; H01L 21/32139; H01L 29/66553; H01L 29/6653
See application file for complete search history.

(56) References Cited

U.S. PATENT DOCUMENTS

| 6,855,640 | B2 | 2/2005 | Tung et al. | |
|---|---|---|---|---|
| 6,884,715 | B1 | 4/2005 | Kwon et al. | |
| 2002/0132403 | A1* | 9/2002 | Hung | H01L 21/76897 438/186 |
| 2004/0038546 | A1* | 2/2004 | Ko | H01L 21/31116 438/710 |
| 2016/0049487 | A1* | 2/2016 | Xu | H01L 29/41791 257/288 |

* cited by examiner

*Primary Examiner* — Karen Kusumakar
(74) *Attorney, Agent, or Firm* — Williams Morgan, P.C.

(57) ABSTRACT

At least one method, apparatus and system disclosed herein involves forming semiconductor devices comprising vertically aligned gates, metal hard masks, and nitride regions. The semiconductor device may contain a semiconductor substrate; a gate disposed on the semiconductor substrate; a metal hard mask vertically aligned with the gate; a nitride region vertically aligned with the gate and the metal hard mask; and source/drain (S/D) regions disposed in proximity to the gate.

17 Claims, 16 Drawing Sheets

METHODS, APPARATUS AND SYSTEM FOR SELF-ALIGNED METAL HARD MASKS

BACKGROUND OF THE INVENTION

Field of the Invention

Generally, the present disclosure relates to the manufacture of sophisticated semiconductor devices, and more specifically, to various methods for forming self-aligned metal hard masks.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, reducing the physical size of FETs requires precise manufacturing processes.

One such precise manufacturing process involves the use of a nitride hard mask in forming electrical contacts from a FET gate to an overlying structure. Previous workers have formed such contacts using a self-aligned nitride hard mask, wherein a nitride hard mask is formed between vertically-extensive gate spacers. However, forming and removing nitride hard masks from gates has undesirable side effects, such as erosion of capping layers on gates, erosion of gate spacers, and loss of gate height.

Accordingly, it would be desirable to form electrical contacts while reducing erosion of capping layers on gates, erosion of gate spacers, and loss of gate height.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and system for forming a semiconductor device comprising a semiconductor substrate; a gate disposed on the semiconductor substrate; a metal hard mask vertically aligned with the gate; a nitride region vertically aligned with the gate and the metal hard mask; and source/drain (S/D) regions disposed in proximity to the gate.

Semiconductor devices according to embodiments herein may be processed with reduced erosion of capping layers on gates, reduced erosion of gate spacers, reduced loss of gate height, or two or more thereof.

BRIEF DESCRIPTION OF THE DRAWINGS

The disclosure may be understood by reference to the following description taken in conjunction with the accompanying drawings, in which like reference numerals identify like elements, and in which.

Figure 1:
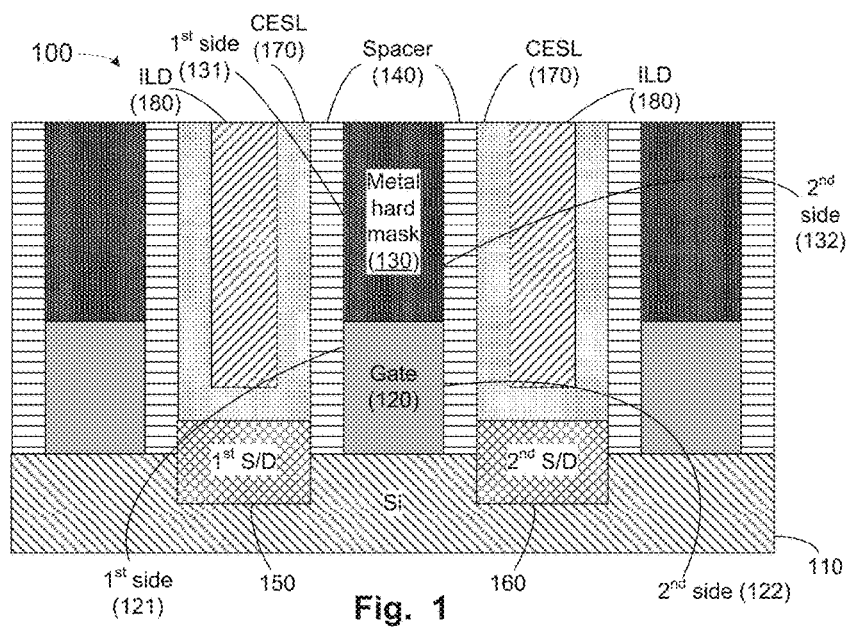
FIG. 1 illustrates a stylized cross-sectional view of a semiconductor device in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing one or more process operations to form semiconductor devices comprising a semiconductor substrate; a gate disposed on the semiconductor substrate; a metal hard mask vertically aligned with the gate; a nitride region vertically aligned with the gate and the metal hard mask; and source/drain (S/D) regions disposed in proximity to the gate. The process operations described herein may yield semiconductor devices maintaining gate height, cap volume, and spacer volume during processing.

FIG. 1 presents a stylized cross-sectional view of a semiconductor device 100 with respect to a first stage of manufacture thereof and in accordance with embodiments herein. The semiconductor device 100 comprises a substrate 110. In the depicted embodiment, substrate 110 comprises silicon. In other embodiments (not shown), the substrate 110 may comprise other semiconductor substrate materials or structures known to the person of ordinary skill in the art.

The semiconductor device 100 also contains a gate 120 disposed on the substrate. The gate 120 has substantially the shape of a rectangular prism (in three dimensions) and is substantially rectangular in cross-section. The gate 120 has a first side 121 and a second side 122, with "side" referring to a face of the gate substantially perpendicular to the surface of the substrate 110.

Techniques for forming the gate 120, and materials from which the gate 120 may be formed, may be routinely selected by the person of ordinary skill in the art having the benefit of the present disclosure. In one embodiment, the gate 120 is a high-k metal gate.

The semiconductor device 100 also contains a metal hard mask 130 disposed above the gate 120. The metal hard mask 130 is substantially vertically aligned with the gate 120. In other words, the metal hard mask 130 has substantially the shape of a rectangular prism (in three dimensions) and is substantially rectangular in cross-section; has a first side 131 vertically aligned with the first side 121 of the gate 120; and has a second side 132 vertically aligned with the second side 122 of the gate 120.

Techniques for forming the metal hard mask 130, and materials from which the metal hard mask 130 may be formed, may be routinely selected by the person of ordinary skill in the art having the benefit of the present disclosure. In one embodiment, the metal hard mask 130 comprises tungsten.

The semiconductor device 100 also comprises a spacer 140 disposed on the first sides 121 and 131, and the second sides 122 and 132, of the gate 120 and the metal hard mask 130. The spacer 140 may comprise any material known to the person of ordinary skill in the art as a spacer for field-effect transistor devices and may be formed by any known technique.

The semiconductor device 100 also includes a first source/drain (S/D) region 150 and a second S/D region 160. The first S/D region 150 and the second S/D region 160 are disposed in proximity to the gate 120. In the depicted embodiment, the first S/D region 150 and the second S/D region 160 are shown in physical contact with the spacer 140, although other dispositions in which the first S/D region 150 and the second S/D region 160 are in proximity to the gate 120 will be apparent to the person of ordinary skill in the art.

As shown in the depicted embodiment, the first S/D region 150 and the second S/D region 160 may be partially recessed into the substrate 110. In other embodiments (not shown), the first S/D region 150 and the second S/D region 160 may be disposed on the substrate 110, above the substrate 110, fully recessed in the substrate 110 (meaning the tops of the first S/D region 150 and the second S/D region 160 are coplanar with the surface of the substrate 110), or embedded in the substrate 110 (meaning the tops of the first S/D region 150 and the second S/D region 160 are below the surface of the substrate 110).

Materials and techniques for forming the first S/D region 150 and the second S/D region 160 will be known to the person of ordinary skill in the art.

The semiconductor device 100 also comprises a contact etch stop layer (CESL) 170. The CESL 170 is disposed on (the sides of) spacer 140 and above the first S/D region 150 and the second S/D region 160. The CESL 170 may be considered to line the gap between adjacent gate structures (stacks 120-130-140). The person of ordinary skill in the art will be aware of materials and formation techniques for the CESL 170.

The semiconductor device 100 also comprises an interlayer dielectric (ILD) 180. The ILD 180 is disposed on the CESL 170. The ILD 180 may be considered to fill the gap between adjacent gate structures. Materials suitable for use as the ILD 180 and techniques for forming the ILD 180 are known to the person of ordinary skill in the art and may be selected routinely in light of the present disclosure.

The semiconductor device 100 may also comprise additional liners, barrier layers, and other structures which may provide a benefit to the processes described herein, to the function of a final integrated circuit device comprising the semiconductor device 100, and/or other benefits that will be apparent to the artisan. Such other structures need not be described in detail and are omitted for brevity.

The semiconductor device 100 depicted in the figures shows three gates 120, three metal hard masks 130, etc. This depiction is for convenience only. As the person of ordinary skill in the art will understand, the semiconductor device 100 may comprise one gate 120, two gates 120 . . . N gates 120.

Figure 2:
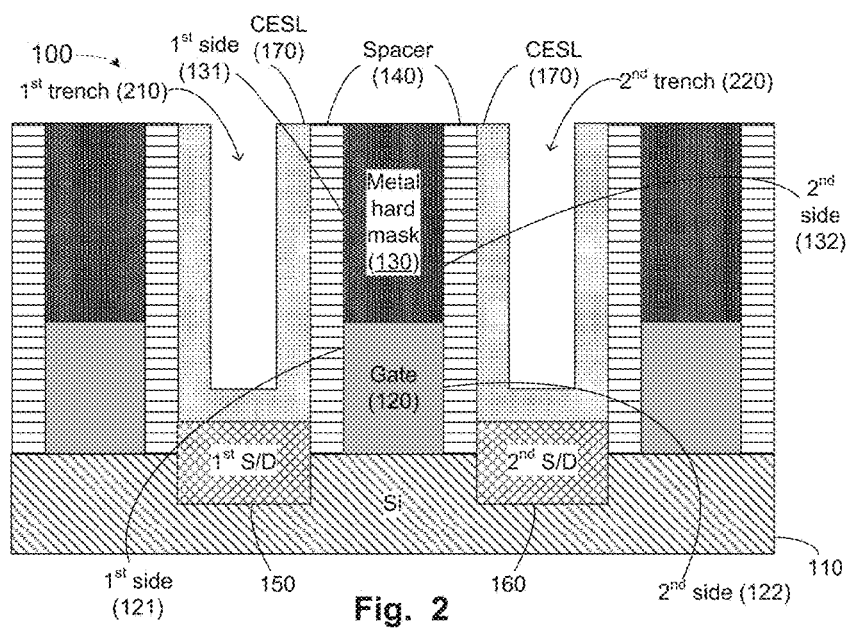
FIG. 2 illustrates a stylized cross-sectional view of the semiconductor device of FIG. 1, with respect to an interlayer dielectric (ILD) removal process, in accordance with embodiments herein.

FIG. 2 presents a stylized cross-sectional view of the semiconductor device 100 of FIG. 1 with respect to an ILD removal process in accordance with embodiments herein. The ILD 180 may be removed by any appropriate technique against which other exposed structures, e.g., the metal hard mask 130, the spacer 140, and the CESL 170 are substantially resistant to removal or damage. Such appropriate techniques will be known to the person of ordinary skill in the art and need not be described further. For example, removal of the ILD 180 may comprise a reactive ion etch (RIE).

Removal of the ILD 180 yields a first trench 210 in proximity to the first sides 121 and 131 of the gate 120 and the metal hard mask 130, and a second trench 220 in proximity to the second sides 122 and 132 of the gate 120 and the metal hard mask 130.

Figure 3:
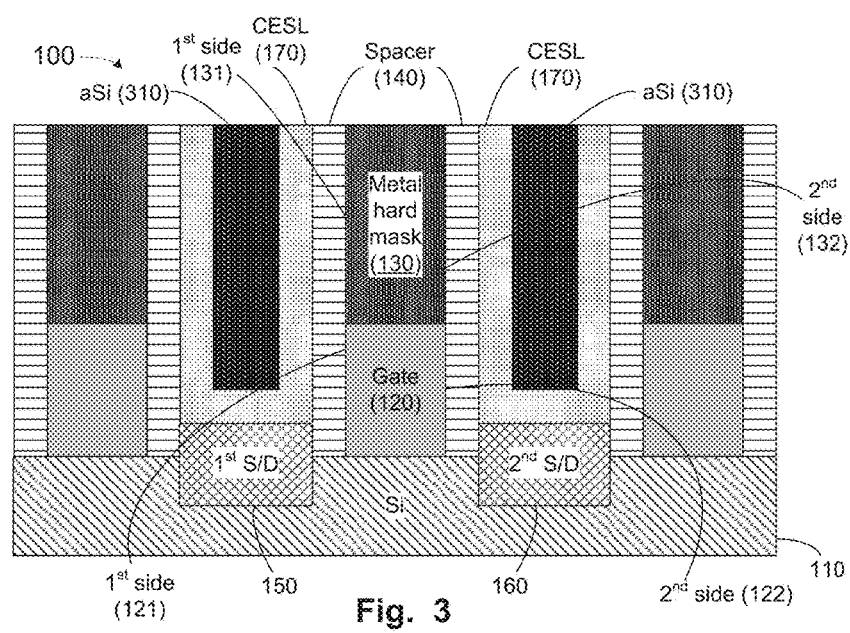
FIG. 3 illustrates a stylized cross-sectional view of the semiconductor device of FIG. 2, with respect to an amorphous silicon (aSi) fill process, in accordance with embodiments herein.

FIG. 3 presents a stylized cross-sectional view of the semiconductor device 100 of FIG. 2 with respect to an amorphous silicon (aSi) fill process in accordance with embodiments herein. The first trench 210 and the second trench 220 may be filled with aSi 310 using any appropriate technique known to the person of ordinary skill in the art. For example, filling the trenches 210, 220 with aSi 310 may involve overfilling with aSi 310, followed by chemical-mechanical polishing (CMP) to planarize the top of aSi 310 to the same height as the metal hard mask 130, the spacer 140, and the CESL 170.

Figure 4:
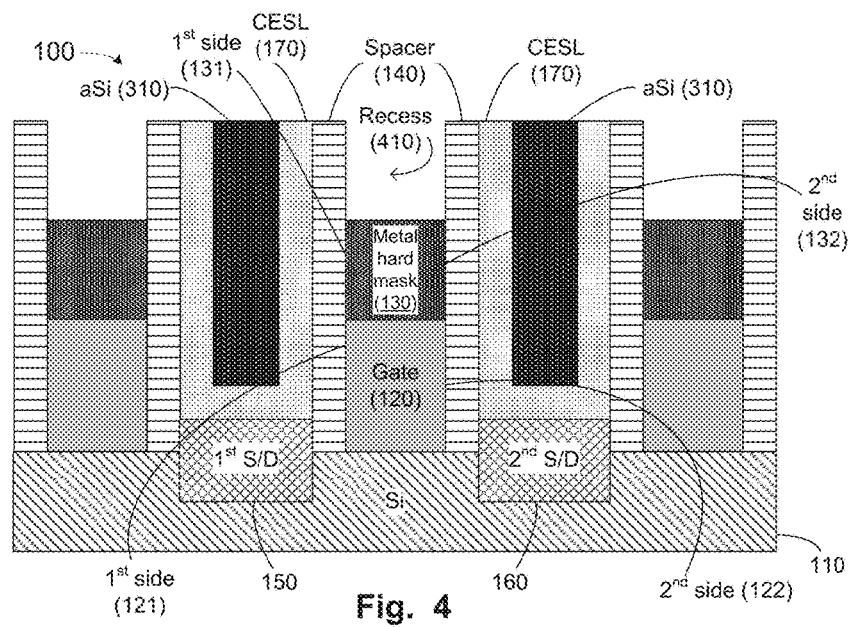
FIG. 4 illustrates a stylized cross-sectional view of the semiconductor device of FIG. 3, with respect to a metal hard mask recession process, in accordance with embodiments herein.

FIG. 4 presents a stylized cross-sectional view of the semiconductor device 100 of FIG. 3 with respect to a metal hard mask recession process in accordance with embodiments herein. The metal hard mask 130 may be recessed using any appropriate technique against which other exposed structures, e.g., the spacer 140, the CESL 170, and the aSi 310 are substantially resistant to removal or damage. The recession process yields a recess 410. The recession process may be performed for a duration and under other conditions sufficient to impart a desired depth to the recess 410 in view of subsequent processes described below.

As can be seen, the recess 410 has a width defined by the spacer 140. The walls of the recess 410 may be considered to be vertically aligned with the sides 121-131 and 122-132 of the gate 120 and the metal hard mask 130.

Figure 5:
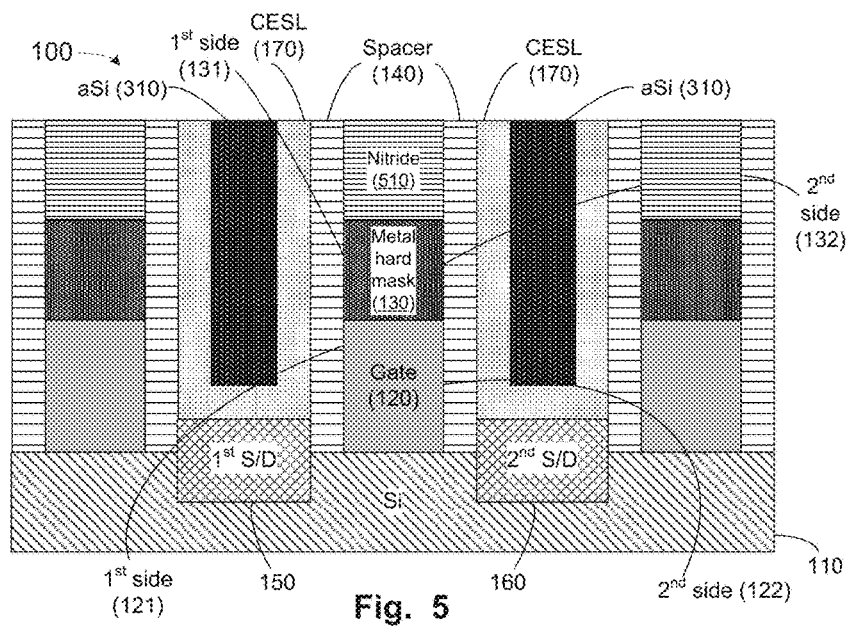
FIG. 5 illustrates a stylized cross-sectional view of the semiconductor device of FIG. 4, with respect to a nitride fill process, in accordance with embodiments herein.

FIG. 5 presents a stylized cross-sectional view of the semiconductor device 100 of FIG. 4 with respect to a nitride fill process in accordance with embodiments herein. A nitride fill region 510 is deposited to fill the recess 410. The nitride region 510 may include any appropriate nitride based material. In one embodiment, the nitride region 510 is formed of silicon nitride. Nitride fill techniques will be known to the person of ordinary skill in the art. For example, filling the recess 410 with nitride 510 may involve overfilling with nitride region 510, followed by CMP.

As can be seen, the nitride region 510 has a width substantially equal to the widths of the metal hard mask 130 and the gate 120. As such, the nitride region 510 may be considered to be formed in a self-aligned process. The semiconductor device 100 may undergo further processing (not shown) in which an overlying metal layer or other conductive feature is provided an electrical connection to the gate 120 by way of the metal hard mask 130 and the nitride 510.

Figure 6:
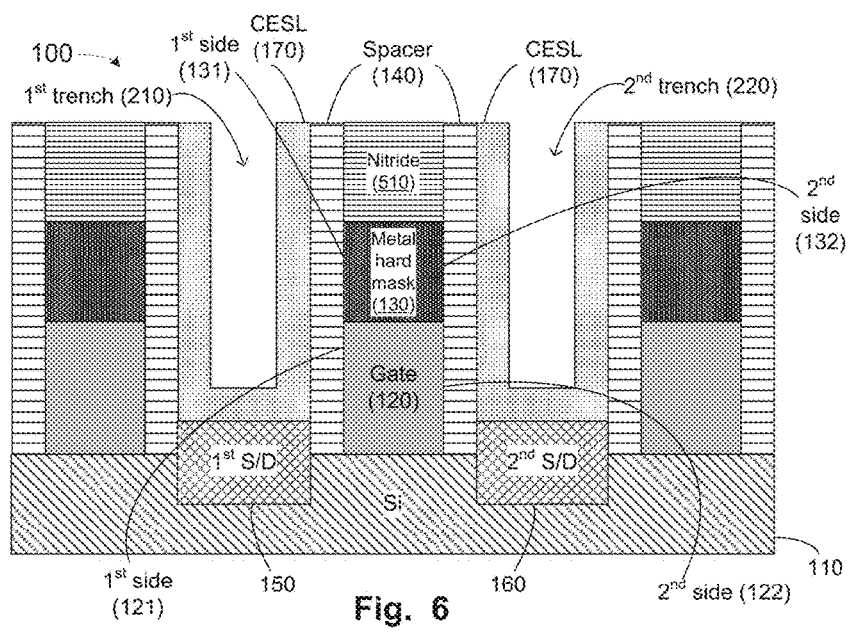
FIG. 6 illustrates a stylized cross-sectional view of the semiconductor device of FIG. 5, with respect to an aSi removal process, in accordance with embodiments herein.

FIG. 6 presents a stylized cross-sectional view of the semiconductor device 100 of FIG. 5 with respect to an aSi removal process in accordance with embodiments herein. The aSi 310 may be removed from the first trench 210 and the second trench 220 using techniques known by the person of ordinary skill in the art having the benefit of the present disclosure.

Figure 7:
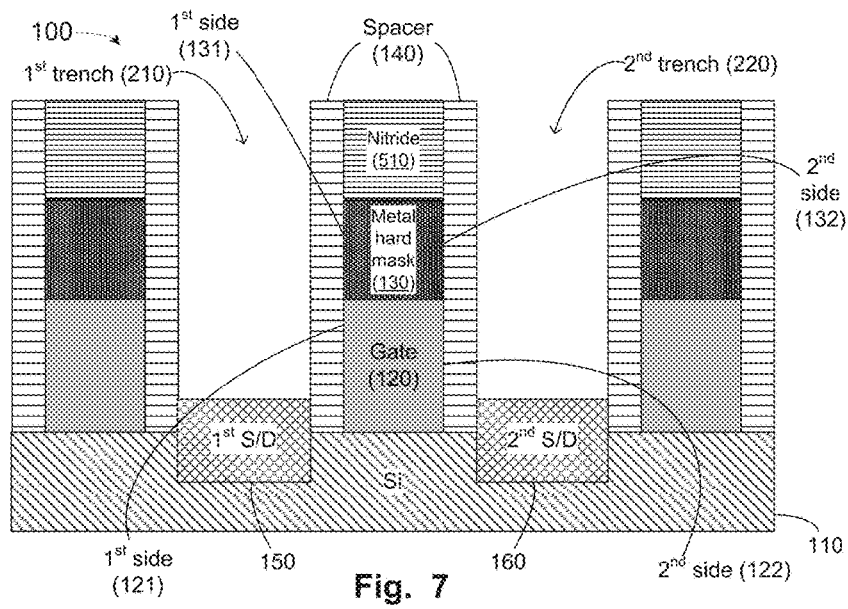
FIG. 7 illustrates a stylized cross-sectional view of the semiconductor device of FIG. 6, with respect to a contact etch stop layer (CESL) removal process, in accordance with embodiments herein.

FIG. 7 presents a stylized cross-sectional view of the semiconductor device 100 of FIG. 6 with respect to a CESL removal process in accordance with embodiments herein. The CESL 170 may be removed from the semiconductor device 100 as a routine matter for the person of ordinary skill in the art having the benefit of the present disclosure.

The processes and descriptions shown in FIGS. 1-7 and described above may be considered a first aspect of the present disclosure. A second aspect of the present disclosure is shown in FIGS. 1-2 and 8-14, and will be described below.

Figure 8:
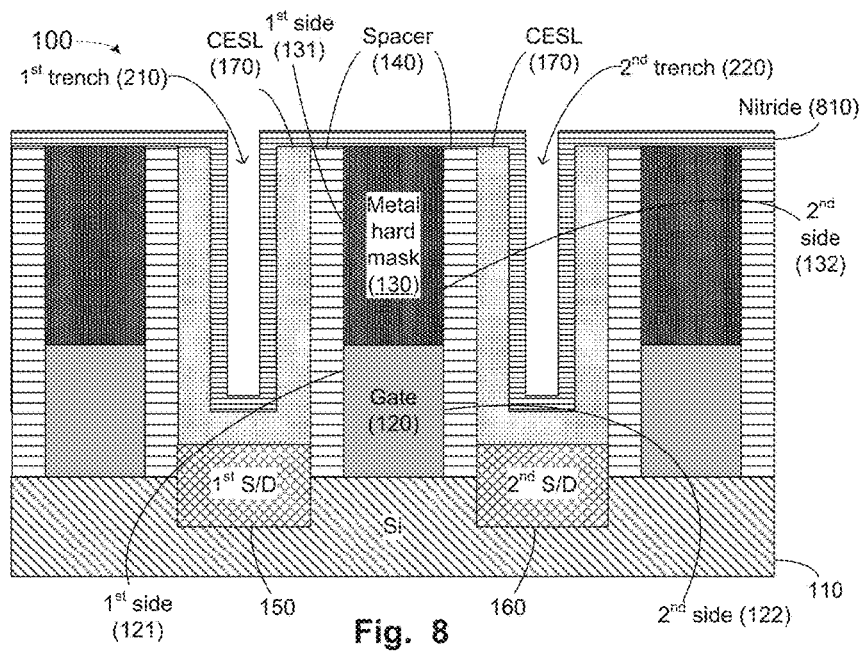
FIG. 8 illustrates a stylized cross-sectional view of the semiconductor device of FIG. 2, with respect to a nitride deposition process, in accordance with embodiments herein.

We turn now to FIG. 8, which depicts a stylized cross-sectional view of the semiconductor device 100 of FIG. 2 with respect to a nitride deposition process in accordance with embodiments herein. A nitride region 810 is deposited, such as by atomic layer deposition (ALD) in the first trench 210, in the second trench 220, over a top of the spacer 140, and over the metal hard mask 130. The nitride region 810 may be formed of silicon nitride. The nitride region 810 partially fills the first trench 210 and the second trench 220.

Figure 9:
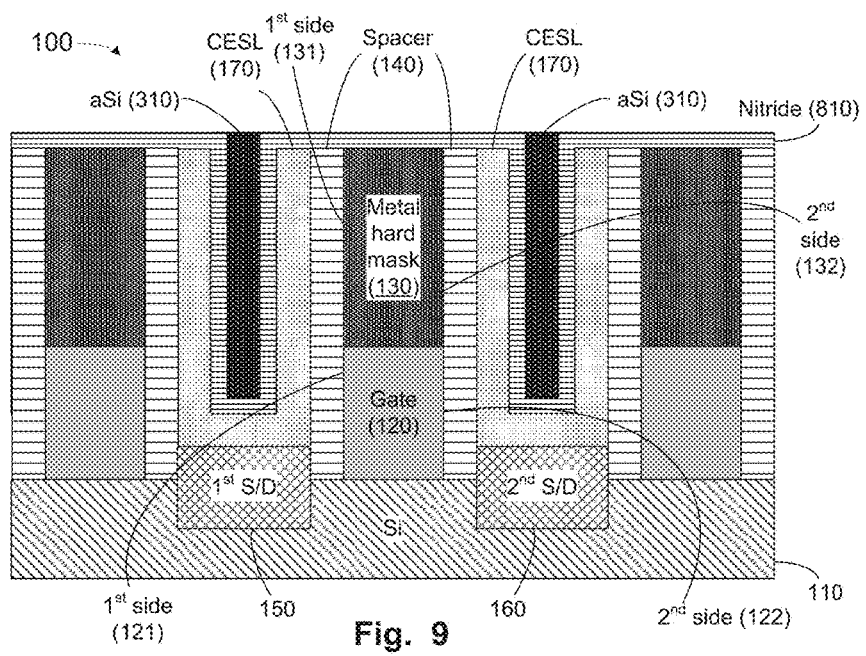
FIG. 9 illustrates a stylized cross-sectional view of the semiconductor device FIG. 8, with respect to an aSi fill process, in accordance with embodiments herein.

FIG. 9 presents a stylized cross-sectional view of the semiconductor device 100 of FIG. 8 with respect to an amorphous silicon deposition process in accordance with embodiments herein. The first trench 210 and the second trench 220 may be filled with aSi 310 similar in the manner described above with respect to FIG. 3.

Figure 10:
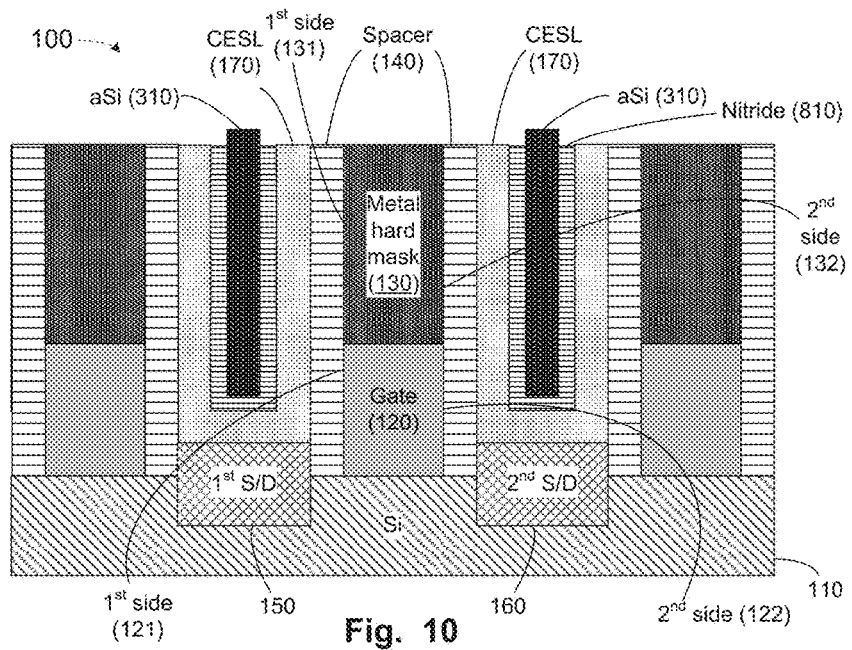
FIG. 10 illustrates a stylized cross-sectional view of the semiconductor device of FIG. 9, with respect to a nitride etch process, in accordance with embodiments herein.

FIG. 10 presents a stylized cross-sectional view of the semiconductor device 100 of FIG. 9 with respect to a nitride etch process in accordance with embodiments herein. The nitride region 810 is etched over the top of the spacer 140 and over the metal hard mask 130. The nitride region 810 may be etched by any technique known to the person of ordinary skill in the art. The nitride region 810 is retained along the sides of the aSi 310 and the spacer 140. After the nitride etch process, the top of the aSi 310 extends above the tops of the spacer 140, the CESL 170, and the remaining nitride region 810.

Figure 11:
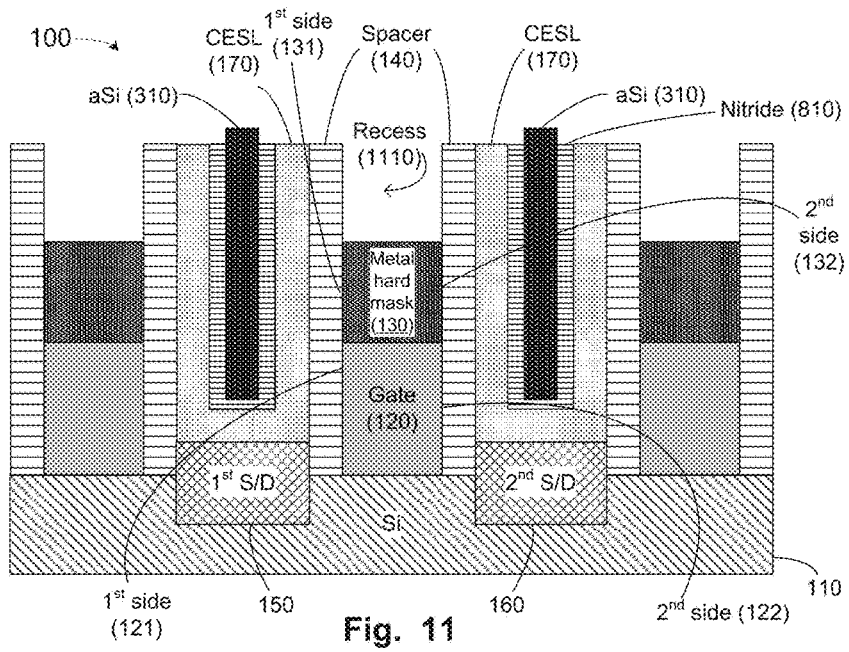
FIG. 11 illustrates a stylized depiction of a cross-sectional view of the semiconductor device of FIG. 10, with respect to a metal hard mask recession process, in accordance with embodiments herein.

FIG. 11 presents a stylized cross-sectional view of the semiconductor device 100 of FIG. 10 with respect to a metal hard mask recession process in accordance with embodiments herein. The metal hard mask 130 may be recessed substantially as described above with reference to FIG. 4. The recession process yields a recess 1110 above the metal hard mask 130. The recess 1110 has a lower width defined by the spacer 140 and an upper width defined by the aSi 310.

Figure 12:
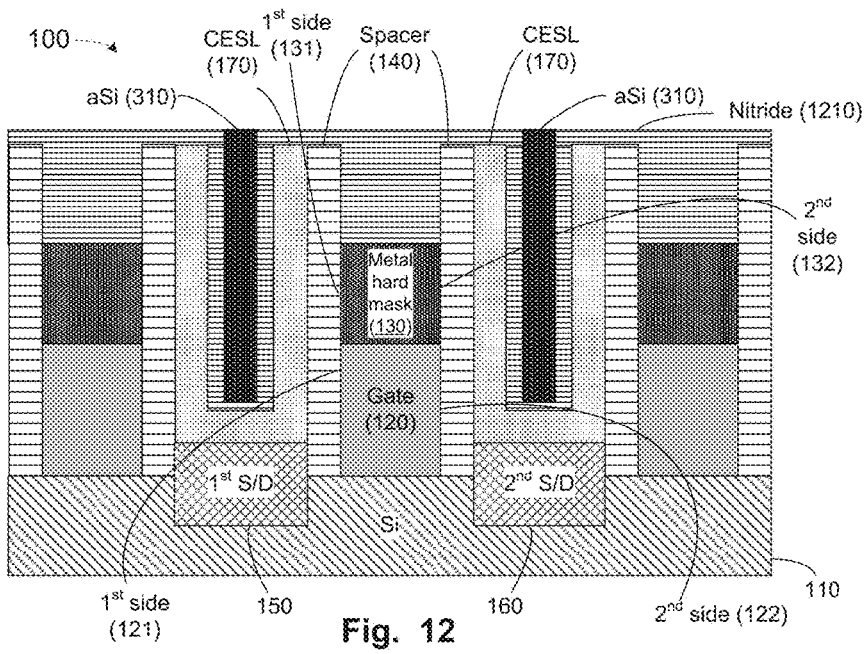
FIG. 12 illustrates a stylized cross-sectional view of the semiconductor device of FIG. 11, with respect to a nitride fill process, in accordance with embodiments herein.

FIG. 12 presents a stylized cross-sectional view of the semiconductor device 100 of FIG. 11 with respect to nitride fill process in accordance with embodiments herein. The recess 1110 may be filled with a nitride region 1210, such as silicon nitride, substantially as described above regarding FIG. 5. The nitride region 1210 may be the same nitride as the nitride region 510, but need not be.

Figure 13:
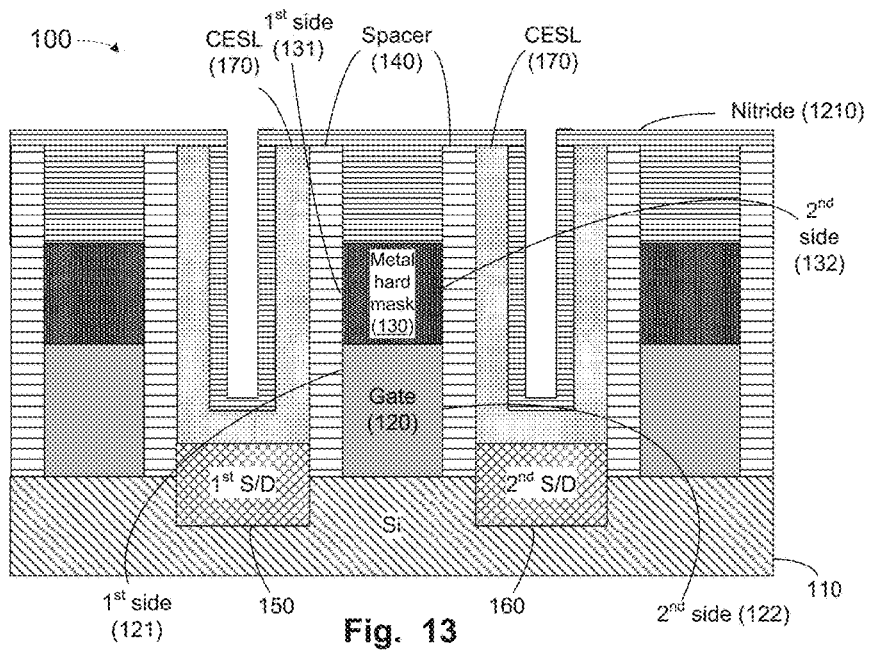
FIG. 13 a stylized cross-sectional view of the semiconductor device of FIG. 12, with respect to an aSi removal process, in accordance with embodiments herein.

FIG. 13 presents a stylized cross-sectional view of the semiconductor device 100 of FIG. 12 with respect to an aSi removal process in accordance with embodiments herein. The aSi 310 may be removed from the first trench 210 and the second trench 220 substantially as described above regarding FIG. 6.

Figure 14:
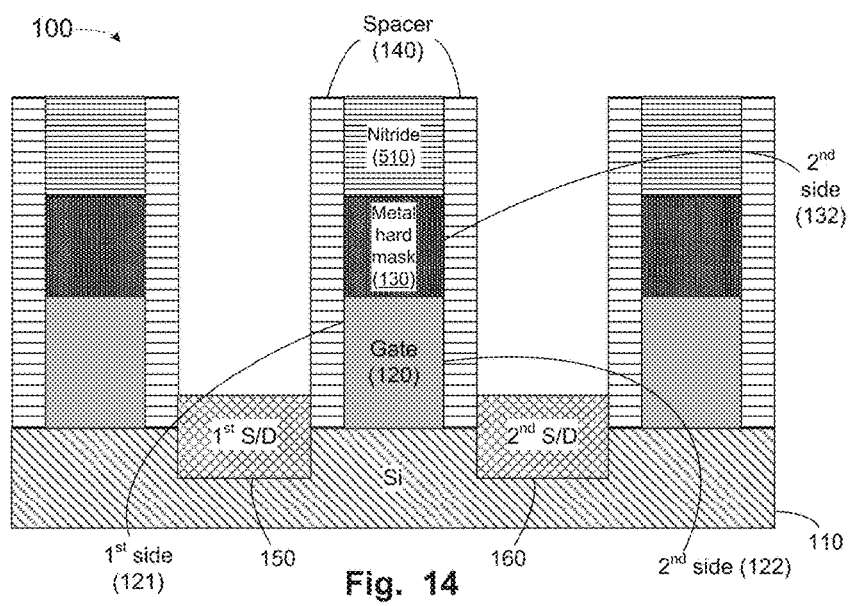
FIG. 14 illustrates a stylized cross-sectional view of the semiconductor device of FIG. 13, with respect to nitride etching and CESL removal processes, in accordance with embodiments herein.

FIG. 14 presents a stylized cross-sectional view of the semiconductor device 100 of FIG. 13 with respect to a CESL removal process in accordance with embodiments herein. The CESL 170 may be removed from the semiconductor device 100 substantially as described above regarding FIG. 7.

A third aspect of the present disclosure is shown in FIGS. 1 and 15-23, and will be described below.

Figure 15:
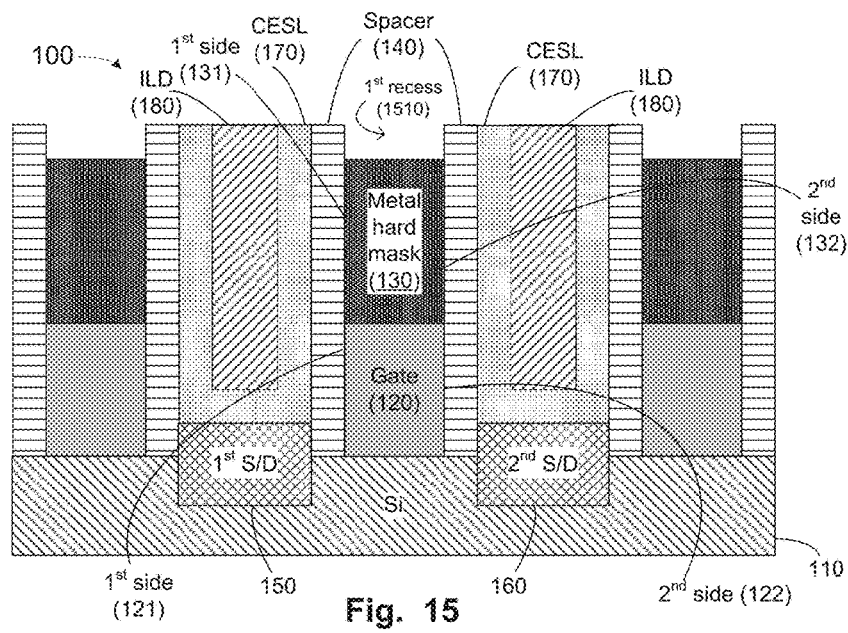
FIG. 15 illustrates a stylized cross-sectional view of the semiconductor device of FIG. 1, with respect to a first metal hard mask recession process, in accordance with embodiments herein.

FIG. 15 presents a stylized cross-sectional view of the semiconductor device 100 of FIG. 1 with respect to a metal hard mask recession process in accordance with embodiments herein. The metal hard mask 130 may be recessed substantially as described above with reference to FIG. 4. The metal hard mask 130 may be recessed in this process to below a top of the spacer, to yield a first recess 1510. The width of the first recess 1510 is defined by the spacer 140. The metal hard mask 130 after this recession has a first height such that the top of the metal hard mask 130 is below the top of the spacer 140. The metal hard mask 130 will be recessed to a lower height in a later step of the third aspect of the present disclosure.

Figure 16:
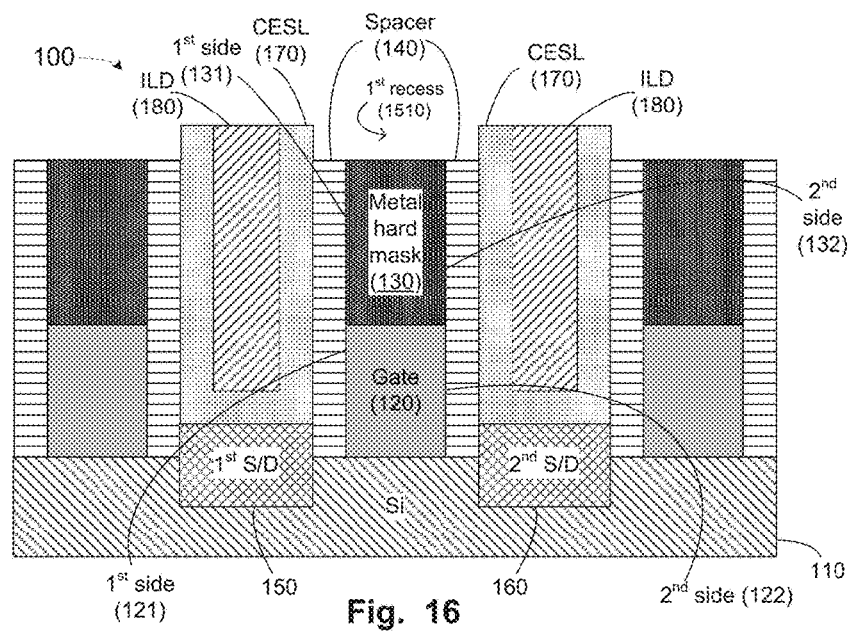
FIG. 16 illustrates a stylized cross-sectional view of the semiconductor device of FIG. 15, with respect to an partial spacer removal process, in accordance with embodiments herein.

FIG. 16 presents a stylized cross-sectional view of the semiconductor device 100 of FIG. 15 with respect to a spacer recession process in accordance with embodiments herein. In this process, the top of the spacer 140 is lowered to the first height, i.e., the top of the spacer 140 after this process is at the same height as the top of the metal hard mask 130. The spacer recession process widens the first recess 1510, i.e., the width of the first recess 1510 is now defined by the CESL 170.

Figure 17:
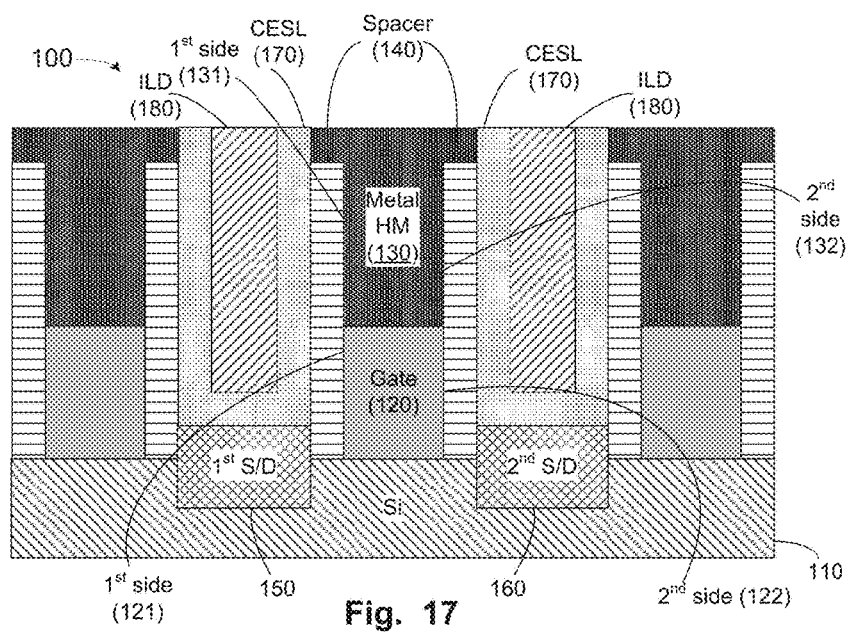
FIG. 17 illustrates a stylized cross-sectional view of the semiconductor device of FIG. 16, with respect to a metal hard mask deposition process, in accordance with embodiments herein.

FIG. 17 presents a stylized cross-sectional view of the semiconductor device 100 of FIG. 16 with respect to a metal hard mask addition process in accordance with embodiments herein. Metal is added to the metal hard mask 130 by any appropriate technique, which may involve overfilling and CMP to the top of the CESL 170 and the ILD 180. The addition of metal to the metal hard mask fills the widened first recess 1510. The metal hard mask 130 after metal addition has a lower portion with a width defined by the spacer 140 and an upper portion with a width defined by the CESL 170.

Figure 18:
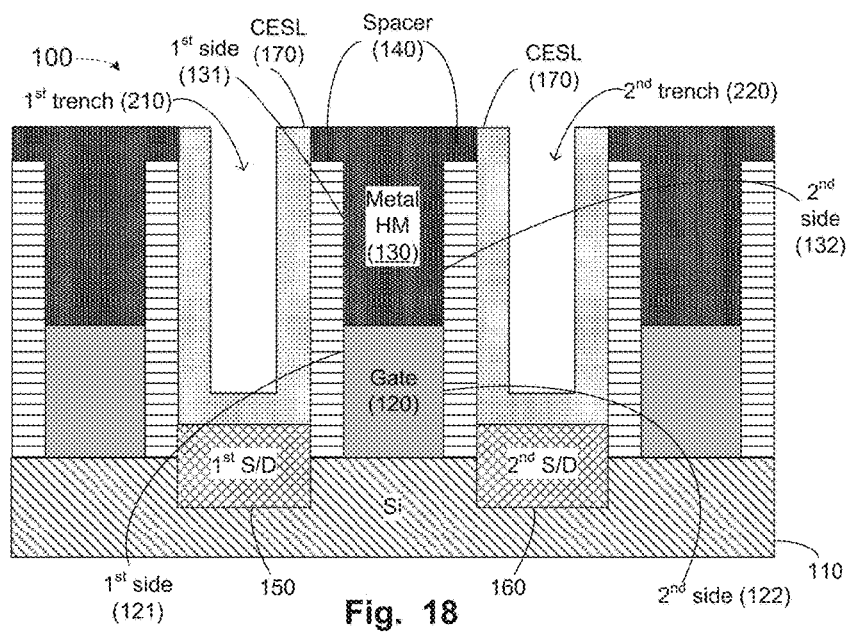
FIG. 18 illustrates a stylized cross-sectional view of the semiconductor device of FIG. 17, with respect to an ILD removal process, in accordance with embodiments herein.

FIG. 18 presents a stylized cross-sectional view of the semiconductor device 100 of FIG. 17 with respect to an ILD removal process in accordance with embodiments herein. The ILD 180 may be removed substantially as described above regarding FIG. 2. Removal of the ILD 180 yields a first trench 210 and a second trench 220.

Figure 19:
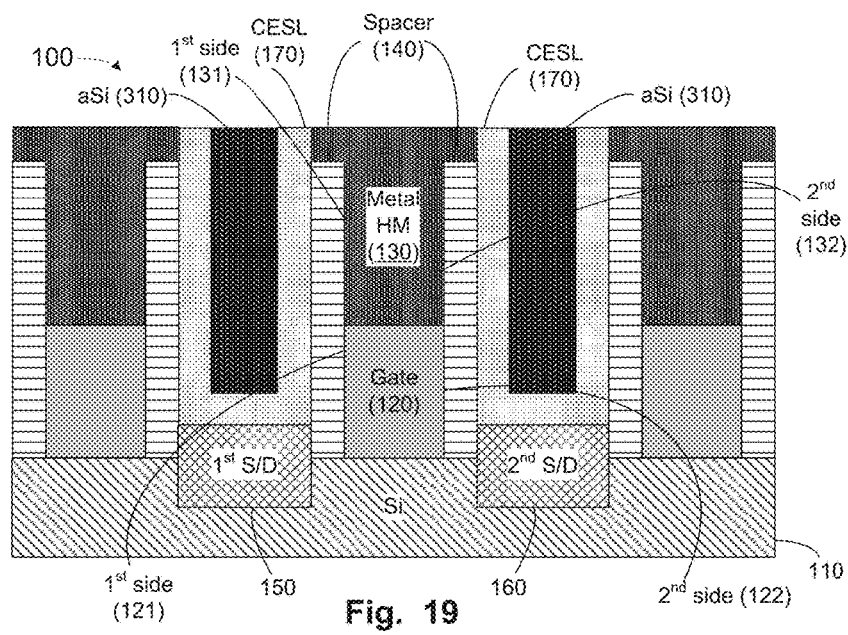
FIG. 19 illustrates a stylized cross-sectional view of the semiconductor device of FIG. 18, with respect to an aSi fill process, in accordance with embodiments herein.

FIG. 19 presents a stylized cross-sectional view of the semiconductor device 100 of FIG. 18 with respect to an aSi fill process in accordance with embodiments herein. The first trench 210 and the second trench 220 may be filled with aSi 310 substantially as described above regarding FIG. 3.

Figure 20:
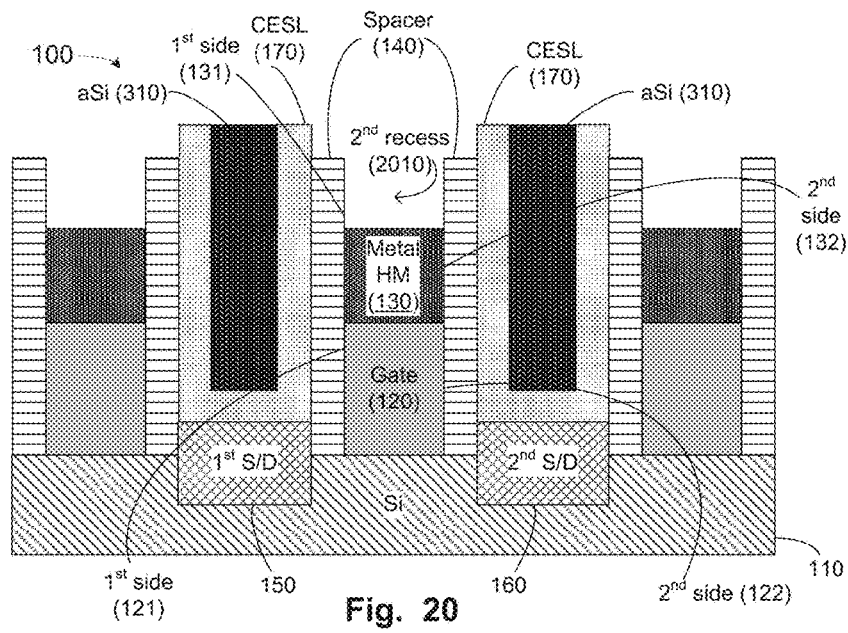
FIG. 20 illustrates a stylized cross-sectional view of the semiconductor device of FIG. 15, with respect to metal hard mask recession process, in accordance with embodiments herein.

FIG. 20 presents a stylized cross-sectional view of the semiconductor device 100 of FIG. 19 with respect to a second metal hard mask recession process in accordance with embodiments herein. The metal hard mask 130 may be recessed by techniques described above. In this recession process, the top of the metal hard mask 130 is lowered to below a top of the spacer 140. In other words, the metal hard mask 130 after this recession process has a second height less than the first height shown in FIG. 15. This recession process yields a T-shaped second recess 2010.

Figure 21:
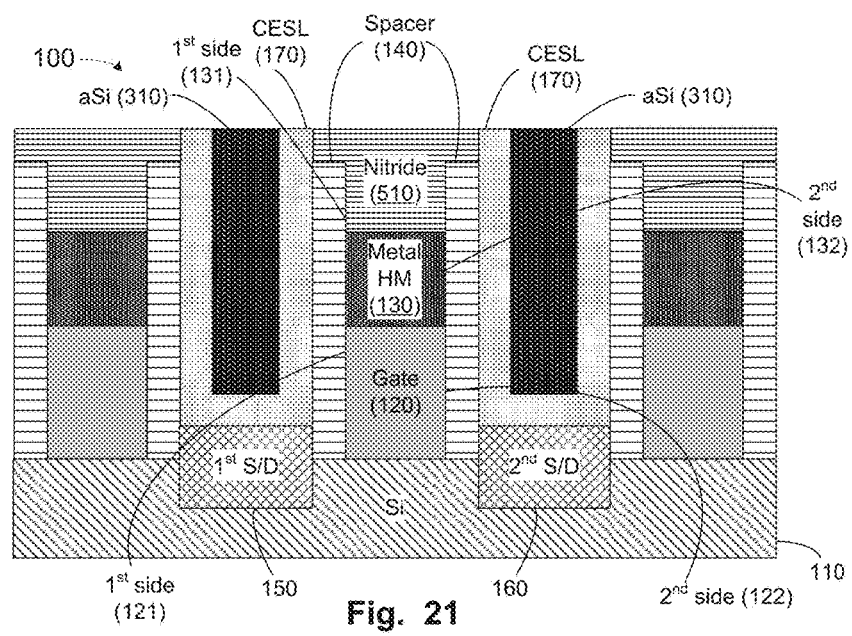
FIG. 21 illustrates a stylized cross-sectional view of the semiconductor device of FIG. 20, with respect to a nitride fill process, in accordance with embodiments herein.

FIG. 21 presents a stylized cross-sectional view of the semiconductor device 100 of FIG. 20 with respect to a nitride fill process in accordance with embodiments herein. The nitride layer 510 may be deposited in the second recess 2010 in a similar manner as described with regard to FIG. 5 above. Filling the second recess 2010 with the nitride layer 510 results in a T-shaped nitride structure having a lower portion having a width defined by the spacer 140 and an upper portion having a width defined by the CESL 170.

Figure 22:
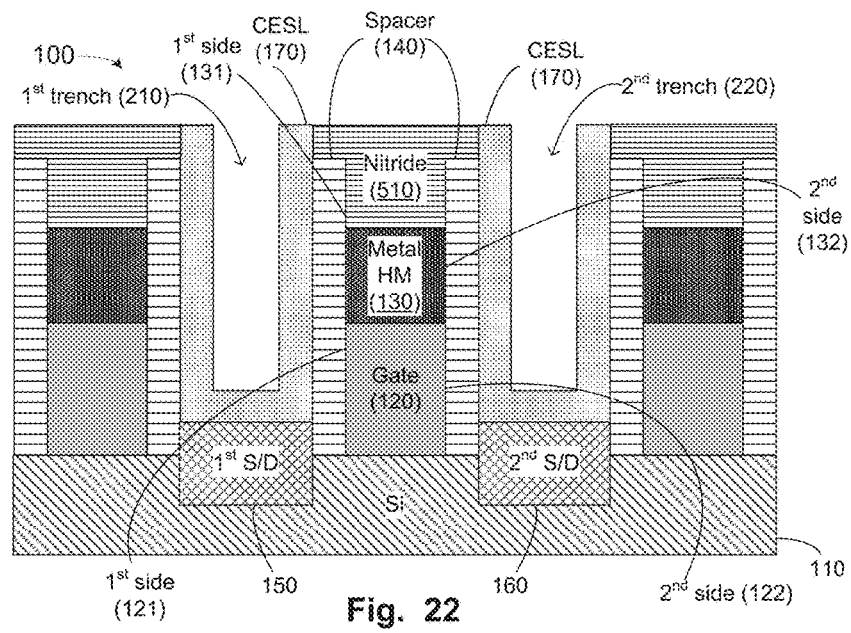
FIG. 22 illustrates a stylized cross-sectional view of the semiconductor device of FIG. 21, with respect to an aSi removal process, in accordance with embodiments herein.

FIG. 22 presents a stylized cross-sectional view of the semiconductor device 100 of FIG. 21 with respect to an aSi removal process in accordance with embodiments herein. The aSi 310 may be removed from the first trench 210 and the second trench 220 substantially as described above regarding FIG. 6.

Figure 23:
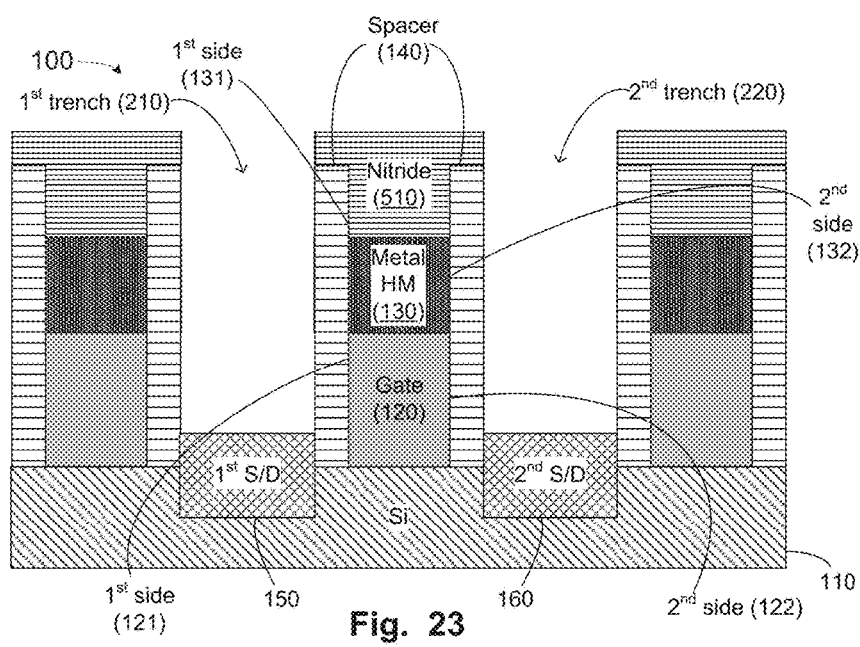
FIG. 23 illustrates a stylized cross-sectional view of the semiconductor device of FIG. 22, with respect to a CESL removal process, in accordance with embodiments herein.

FIG. 23 presents a stylized cross-sectional view of the semiconductor device 100 of FIG. 22 with respect to a CESL removal process in accordance with embodiments herein.

The CESL 170 may be removed from the semiconductor device 100 substantially as described above regarding FIG. 7.

Figure 24:
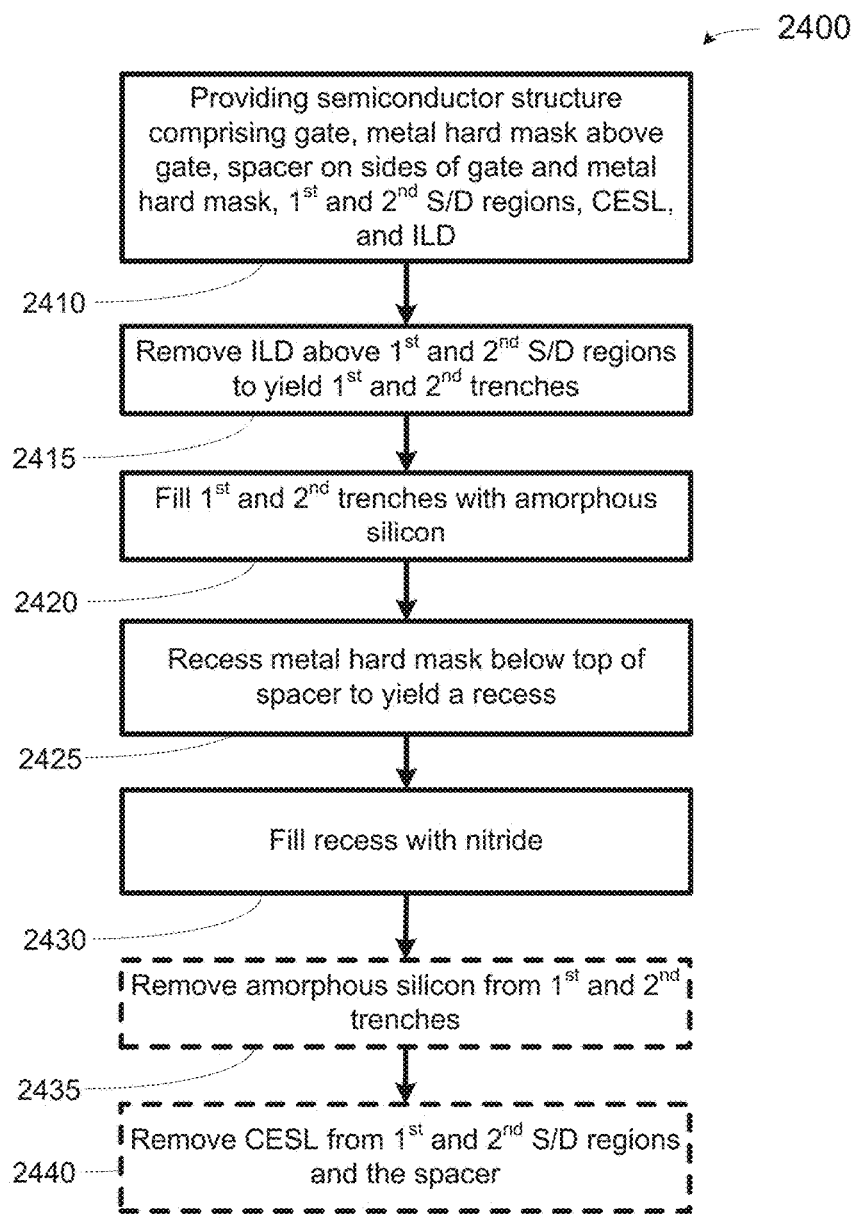
FIG. 24 illustrates a flowchart depiction of a first method for forming a semiconductor device in accordance with embodiments herein.

Turning to FIG. 24, a flowchart depiction of a method 2400 for forming a semiconductor device in accordance with a first aspect of the disclosure is illustrated. The method 2400 comprises providing (at 2410) a semiconductor structure comprising a semiconductor substrate; a gate disposed on the semiconductor substrate and having a first side and a second side; a metal hard mask disposed on the gate and having a first side and a second side, wherein the first side of the metal hard mask is vertically aligned with the first side of the gate and the second side of the metal hard mask is vertically aligned with the second side of the gate; a spacer disposed on the first sides of the gate and the metal hard mask and on the second sides of the gate and the metal hard mask; a first source/drain (S/D) region disposed in proximity to the first side of the gate; a second S/D region disposed in proximity to the second side of the gate; a contact etch stop layer (CESL) disposed on the first S/D region, the second S/D region, and on the spacer; and an interlayer dielectric (ILD) disposed on the CESL above the first S/D region and above the second S/D region. An example of a semiconductor structure that may be provided (at 2410) is shown in FIG. 1.

In one embodiment, the metal may be tungsten. Alternatively or in addition, the gate may be a high-k metal gate.

The method 2400 also comprises removing (at 2415) the ILD above the first S/D region and above the second S/D region, to yield a first trench above the first S/D region and a second trench above the second S/D region. The method 2400 additionally comprises filling (at 2420) the first trench and the second trench with amorphous silicon. The method 2400 further comprises recessing (at 2425) the metal hard mask below a top of the spacer, to yield a recess. The method 2400 also includes filling (at 2430) the recess with a nitride fill material. In one embodiment, the nitride region may be formed of silicon nitride.

In embodiments, the method 2400 may further comprise one or more of removing (at 2435) the amorphous silicon from the first trench and the second trench; and/or removing (at 2440) the CESL from the first S/D region, the second S/D region, and the spacer.

Figure 25:
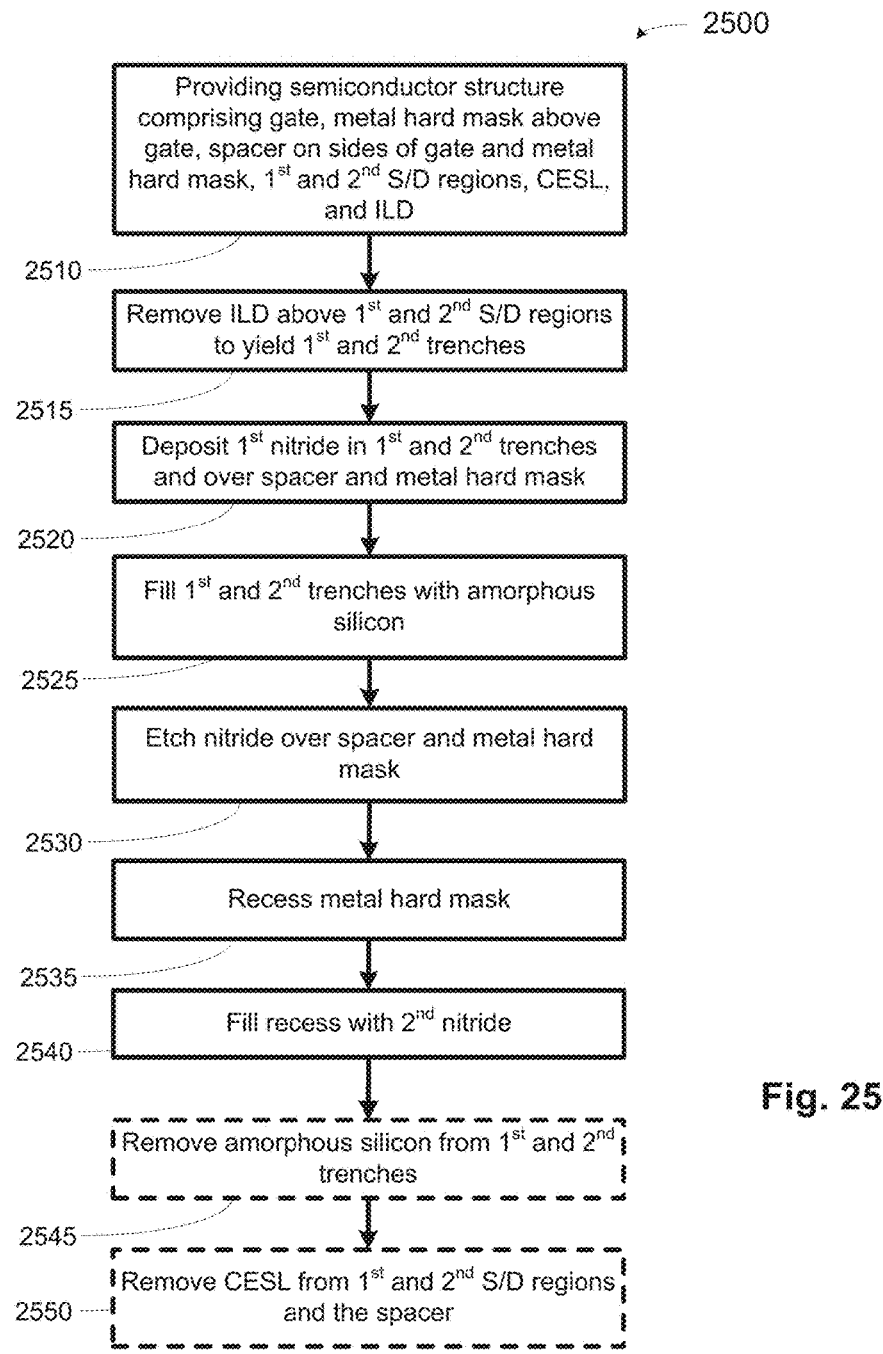
FIG. 25 illustrates a flowchart depiction of a second method for forming a semiconductor device in accordance with embodiments herein.

Turning to FIG. 25, a flowchart depiction of a method 2500 for forming a semiconductor device in accordance with a second aspect of the disclosure is illustrated. The method 2500 comprises providing (at 2510) a semiconductor structure comprising a semiconductor substrate; a gate disposed on the semiconductor substrate and having a first side and a second side; a metal hard mask disposed on the gate and having a first side and second side, wherein the first side of the metal hard mask is vertically aligned with the first side of the gate and the second side of the metal hard mask is vertically aligned with the second side of the gate; a spacer disposed on the first sides of the gate and the metal hard mask and on the second sides of the gate and the metal hard mask; a first source/drain (S/D) region disposed in proximity to the first side of the gate; a second S/D region disposed in proximity to the second side of the gate; a contact etch stop layer (CESL) disposed on the first S/D region, the second S/D region, and on the spacer; and an interlayer dielectric (ILD) disposed on the CESL above the first S/D region and above the second S/D region. An example of a semiconductor structure that may be provided (at 2510) is shown in FIG. 1.

In one embodiment, the metal may be tungsten. Alternatively or in addition, the gate may be a high-k metal gate.

The method 2500 also comprises removing (at 2515) the ILD above the first S/D region and above the second S/D region, to yield a first trench above the first S/D region and a second trench above the second S/D region. The method 2500 further comprises depositing (at 2520) a first nitride region in the first trench, in the second trench, over a top of the spacer, and over the metal hard mask. In one embodiment, the first nitride region may be formed of silicon nitride. Alternatively or in addition, the first nitride region may be deposited by ALD. The method 2500 additionally comprises filling (at 2525) the first trench and the second trench with amorphous silicon.

Subsequently, the method 2500 comprises etching (at 2530) the nitride region over the top of the spacer and over the metal hard mask. The method 2500 also comprises recessing (at 2535) the metal hard mask below a top of the spacer, to yield a recess. The method 2500 yet further comprises filling (at 2540) the recess with a second nitride region.

In embodiments, the method 2500 may further comprise one or more of removing (at 2545) the amorphous silicon from the first trench and the second trench; and/or removing (at 2550) the CESL from the first S/D region, the second S/D region, and the spacer.

Figure 26:
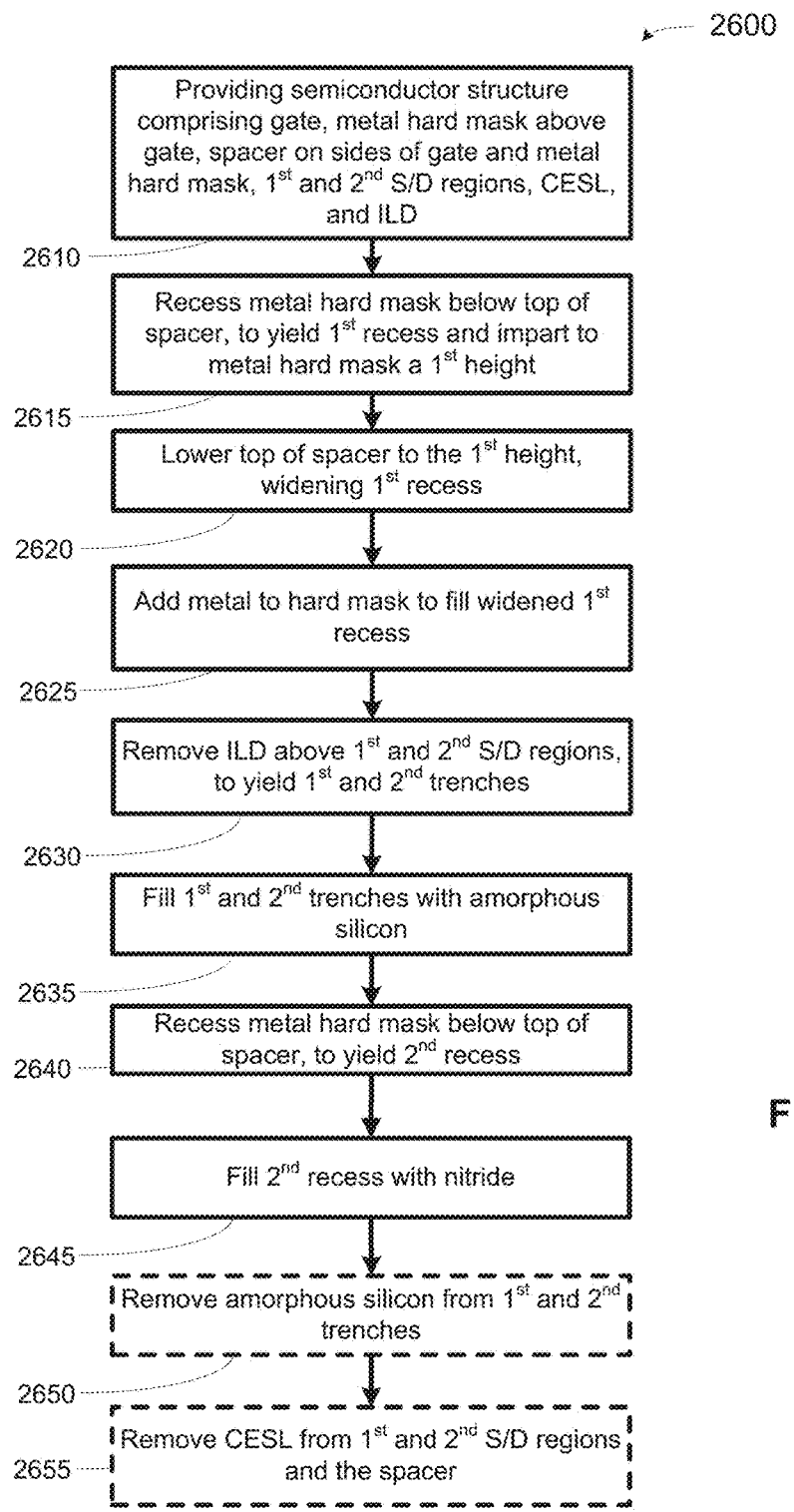
FIG. 26 illustrates a flowchart depiction of a third method for forming a semiconductor device in accordance with embodiments herein.

Turning to FIG. 26, a flowchart depiction of a method 2600 for forming a semiconductor device in accordance with a third aspect of the disclosure is illustrated. The method 2600 comprises providing (at 2610) a semiconductor structure comprising a semiconductor substrate; a gate disposed on the semiconductor substrate and having a first side and a second side; a metal hard mask disposed on the gate and having a first side and second side, wherein the first side of the metal hard mask is vertically aligned with the first side of the gate and the second side of the metal hard mask is vertically aligned with the second side of the gate; a spacer disposed on the first sides of the gate and the metal hard mask and on the second sides of the gate and the metal hard mask; a first source/drain (S/D) region disposed in proximity to the first side of the gate; a second S/D region disposed in proximity to the second side of the gate; a contact etch stop layer (CESL) disposed on the first S/D region, the second S/D region, and on the spacer; and an interlayer dielectric (ILD) disposed on the CESL above the first S/D region and above the second S/D region. An example of a semiconductor structure that may be provided (at 2610) is shown in FIG. 1.

In one embodiment, the metal may be tungsten. Alternatively or in addition, the gate may be a high-k metal gate.

The method 2600 also comprises recessing (at 2615) the metal hard mask below a top of the spacer, to yield a first recess and to impart to the metal hard mask a first height. The method 2600 additionally comprises lowering (at 2620) the top of the spacer to the first height, thereby widening the first recess. The method 2600 further comprises adding (at 2625) metal to the metal hard mask, to fill the widened first recess. The method 2600 yet further comprises removing (at 2630) the ILD above the first S/D region and above the second S/D region, to yield a first trench above the first S/D region and a second trench above the second S/D region. The method 2600 still further comprises filling (at 2635) the first trench and the second trench with amorphous silicon.

Subsequently, the method 2600 also comprises recessing (at 2640) the metal hard mask below a top of the spacer, to yield a second recess and to impart to the metal hard mask a second height less than the first height. The method 2600 further comprises filling (at 2645) the second recess with a nitride material, forming a nitride region. In one embodiment, the nitride region may be formed of silicon nitride.

In embodiments, the method 2600 may further comprise one or more of removing (at 2645) the amorphous silicon from the first trench and the second trench; and/or removing (at 2650) the CESL from the first S/D region, the second S/D region, and the spacer.

Figure 27:
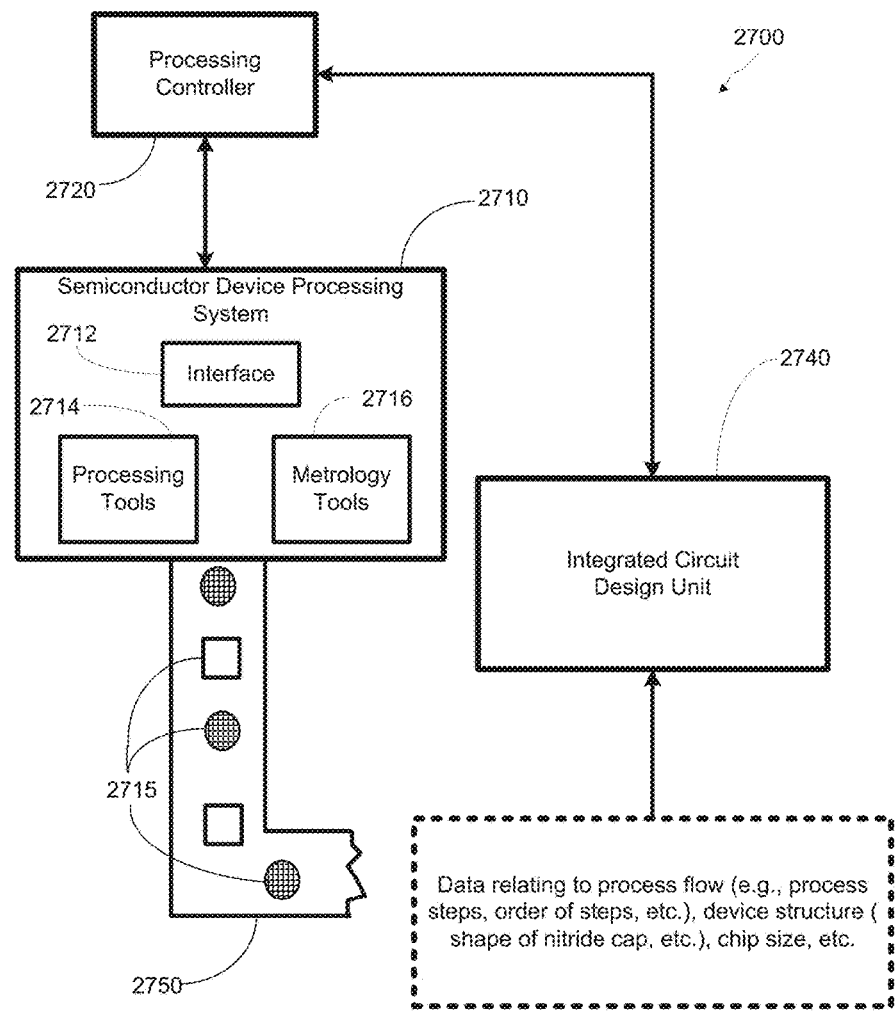
FIG. 27 illustrates a stylized depiction of a system for fabricating a semiconductor device in accordance with embodiments herein.

Turning now to FIG. 27, a stylized depiction of a system 2700 for fabricating a semiconductor device comprising an integrated circuit in accordance with embodiments herein is illustrated. The system 2700 provides for forming a nitride region, e.g., formed of silicon nitride, above a metal hard mask, such as tungsten, above a gate, such as a high-k metal gate, such that the nitride region, the metal hard mask, and the gate are vertically aligned. The system 2700 of FIG. 27 may comprise a semiconductor device processing system 2710 and an integrated circuit design unit 2740. The semiconductor device processing system 2710 may manufacture integrated circuit devices based upon one or more designs provided by the integrated circuit design unit 2740.

The semiconductor device processing system 2710 may comprise various processing stations, such as etch process stations, photolithography process stations, CMP process stations, etc. One or more of the processing steps performed by the processing system 2710 may be controlled by the processing controller 2720. The processing controller 2720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2710 may produce integrated circuits on a medium, such as silicon wafers. More particularly, the semiconductor device processing system 2710 may produce semiconductor devices having one or more gates, metal hard masks, and nitride regions, as described above.

The production of integrated circuits by the device processing system 2710 may be based upon the circuit designs provided by the integrated circuits design unit 2740. The processing system 2710 may provide processed integrated circuits/devices 2715 on a transport mechanism 2750, such as a conveyor system. In some embodiments, the conveyor system may be sophisticated clean room transport systems that are capable of transporting semiconductor wafers.

In some embodiments, the items labeled "2715" may represent individual wafers, and in other embodiments, the items 2715 may represent a group of semiconductor wafers, e.g., a "lot" of semiconductor wafers. The integrated circuit or device 2715 may be a transistor, a capacitor, a resistor, a memory cell, a processor, and/or the like.

The integrated circuit design unit 2740 of the system 2700 is capable of providing a circuit design that may be manufactured by the semiconductor processing system 2710. The integrated circuit design unit 2740 may be capable of determining various features of the process flow (e.g., parameters of processes, whether or not various processes are performed, variations in the order of processes, etc.), the device structure (e.g., the number and location of processors, memory devices, etc.; the height, width, and shape of gates, metal hard masks, and nitride regions, etc.). Based upon such details of the devices, the integrated circuit design unit 2740 may determine specifications of the semiconductor devices that are to be manufactured. Based upon these specifications, the integrated circuit design unit 2740 may provide data for manufacturing a semiconductor device having the features provided by embodiments herein.

The system 2700 may be capable of performing analysis and manufacturing of various products involving various technologies. For example, the system 2700 may design and manufacture devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, unless recited in the claims of an application or an allowed patent. It is therefore evident that the particular embodiments disclosed above may be altered or modified and all such variations are considered within the scope and spirit of the invention.

In one or more embodiments, the disclosure relates to one or more of the following numbered sections.

101. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
provide a semiconductor structure comprising:
a semiconductor substrate;
a gate disposed on the semiconductor substrate and having a first side and a second side;
a metal hard mask disposed on the gate and having a first side and second side, wherein the first side of the metal hard mask is vertically aligned with the first side of the gate and the second side of the metal hard mask is vertically aligned with the second side of the gate;
a spacer disposed on the first sides of the gate and the metal hard mask and on the second sides of the gate and the metal hard mask;
a first source/drain (S/D) region disposed in proximity to the first side of the gate;
a second S/D region disposed in proximity to the second side of the gate;
a contact etch stop layer (CESL) disposed on the first S/D region, the second S/D region, and on the spacer; and
an interlayer dielectric (ILD) disposed on the CESL above the first S/D region and above the second S/D region;
remove the ILD above the first S/D region and above the second S/D region, to yield a first trench above the first S/D region and a second trench above the second S/D region;
fill the first trench and the second trench with amorphous silicon;
recess the metal hard mask below a top of the spacer, to yield a recess; and
fill the recess with a nitride.

102. The system of numbered section 101, wherein the semiconductor device processing system is further adapted to:
remove the amorphous silicon from the first trench and the second trench; and
remove the CESL from the first S/D region, the second S/D region, and the spacer.

103. The system of numbered section 101, wherein the semiconductor device processing system is adapted to provide the metal hard mask as tungsten.

104. The system of numbered section 101, wherein the semiconductor device processing system is adapted to provide the gate as a high-k metal gate.

105. The system of numbered section 101, wherein the semiconductor device processing system is adapted to deposit the nitride as silicon nitride.

A system according to any of numbered sections 101-105 may implement a process depicted by FIGS. 1-7.

201. A method, comprising:
providing a semiconductor structure comprising:
a semiconductor substrate;
a gate disposed on the semiconductor substrate and having a first side and a second side;
a metal hard mask disposed on the gate and having a first side and second side, wherein the first side of the metal hard mask is vertically aligned with the first side of the gate and the second side of the metal hard mask is vertically aligned with the second side of the gate;
a spacer disposed on the first sides of the gate and the metal hard mask and on the second sides of the gate and the metal hard mask;
a first source/drain (S/D) region disposed in proximity to the first side of the gate;
a second S/D region disposed in proximity to the second side of the gate;
a contact etch stop layer (CESL) disposed on the first S/D region, the second S/D region, and on the spacer; and
an interlayer dielectric (ILD) disposed on the CESL above the first S/D region and above the second S/D region;
removing the ILD above the first S/D region and above the second S/D region, to yield a first trench above the first S/D region and a second trench above the second S/D region;
depositing a first nitride in the first trench, in the second trench, over a top of the spacer, and over the metal hard mask;
filling the first trench and the second trench with amorphous silicon;
etching the nitride over the top of the spacer and over the metal hard mask;
recessing the metal hard mask below a top of the spacer, to yield a recess; and
filling the recess with a second nitride.

202. The method of numbered section 201, further comprising:
removing the amorphous silicon from the first trench and the second trench; and
removing the nitride and the CESL from the first S/D region, the second S/D region, and sides of the spacer.

203. The method of numbered section 201, wherein the metal is tungsten.

204. The method of numbered section 201, wherein the gate is a high-k metal gate.

205. The method of numbered section 201, wherein the first nitride and the second nitride are both silicon nitride.

206. The method of numbered section 201, wherein the first nitride is deposited by atomic layer deposition (ALD).

301. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
provide a semiconductor structure comprising:
a semiconductor substrate;
a gate disposed on the semiconductor substrate and having a first side and a second side;
a metal hard mask disposed on the gate and having a first side and second side, wherein the first side of the metal hard mask is vertically aligned with the first side of the gate and the second side of the metal hard mask is vertically aligned with the second side of the gate;
a spacer disposed on the first sides of the gate and the metal hard mask and on the second sides of the gate and the metal hard mask;
a first source/drain (S/D) region disposed in proximity to the first side of the gate;
a second S/D region disposed in proximity to the second side of the gate;
a contact etch stop layer (CESL) disposed on the first S/D region, the second S/D region, and on the spacer; and
an interlayer dielectric (ILD) disposed on the CESL above the first S/D region and above the second S/D region;
remove the ILD above the first S/D region and above the second S/D region, to yield a first trench above the first S/D region and a second trench above the second S/D region;
deposit a first nitride in the first trench, in the second trench, over a top of the spacer, and over the metal hard mask;
fill the first trench and the second trench with amorphous silicon;
etch the first nitride over the top of the spacer and over the metal hard mask;
recess the metal hard mask below a top of the spacer, to yield a recess; and
fill the recess with a second nitride.

302. The system of numbered section 301, wherein the semiconductor device processing system is further adapted to:
remove the amorphous silicon from the first trench and the second trench; and
remove the nitride and the CESL from the first S/D region, the second S/D region, and sides of the spacer.

303. The system of numbered section 301, wherein the semiconductor device processing system is adapted to provide the metal hard mask as tungsten.

304. The system of numbered section 301, wherein the semiconductor device processing system is adapted to provide the gate as a high-k metal gate.

305. The system of numbered section 301, wherein the semiconductor device processing system is adapted to deposit both the first nitride and the second nitride as silicon nitride.

306. The method of numbered section 301, wherein the first nitride is deposited by atomic layer deposition (ALD).

A method according to any of numbered sections 201-206 may be as depicted by FIGS. 1-2, 8-14. A system according to any of numbered sections 301-306 may implement a process as depicted by FIGS. 1-2, 8-14.

401. A method, comprising:
providing a semiconductor structure comprising:
a semiconductor substrate;
a gate disposed on the semiconductor substrate and having a first side and a second side;
a metal hard mask disposed on the gate and having a first side and second side, wherein the first side of the metal hard mask is vertically aligned with the first side of the gate and the second side of the metal hard mask is vertically aligned with the second side of the gate;

a spacer disposed on the first sides of the gate and the metal hard mask and on the second sides of the gate and the metal hard mask;

a first source/drain (S/D) region disposed in proximity to the first side of the gate;

a second S/D region disposed in proximity to the second side of the gate;

a contact etch stop layer (CESL) disposed on the first S/D region, the second S/D region, and on the spacer; and an interlayer dielectric (ILD) disposed on the CESL above the first S/D region and above the second S/D region;

recessing the metal hard mask below a top of the spacer, to yield a first recess and to impart to the metal hard mask a first height;

lowering the top of the spacer to the first height, thereby widening the first recess;

adding metal hard mask, to fill the widened first recess;

removing the ILD above the first S/D region and above the second S/D region, to yield a first trench above the first S/D region and a second trench above the second S/D region;

filling the first trench and the second trench with amorphous silicon;

recessing the metal hard mask below a top of the spacer, to yield a second recess and to impart to the metal hard mask a second height less than the first height; and filling the second recess with a nitride.

402. The method of numbered section 401, further comprising:

removing the amorphous silicon from the first trench and the second trench; and removing the CESL from the first S/D region, the second S/D region, and the spacer.

403. The method of numbered section 401, wherein the metal is tungsten.

404. The method of numbered section 401, wherein the gate is a high-k metal gate.

405. The method of numbered section 401, wherein the nitride is silicon nitride.

501. A system, comprising:

a semiconductor device processing system to manufacture a semiconductor device; and a processing controller operatively coupled to said semiconductor device processing system, said processing controller configured to control an operation of the semiconductor device processing system;

wherein the semiconductor device processing system is adapted to:

provide a semiconductor structure comprising:

a semiconductor substrate;

a gate disposed on the semiconductor substrate and having a first side and a second side;

a metal hard mask disposed on the gate and having a first side and second side, wherein the first side of the metal hard mask is vertically aligned with the first side of the gate and the second side of the metal hard mask is vertically aligned with the second side of the gate;

a spacer disposed on the first sides of the gate and the metal hard mask and on the second sides of the gate and the metal hard mask;

a first source/drain (S/D) region disposed in proximity to the first side of the gate;

a second S/D region disposed in proximity to the second side of the gate;

a contact etch stop layer (CESL) disposed on the first S/D region, the second S/D region, and on the spacer; and an interlayer dielectric (ILD) disposed on the CESL above the first S/D region and above the second S/D region;

recess the metal hard mask below a top of the spacer, to yield a first recess and to impart to the metal hard mask a first height;

lower the top of the spacer to the first height, thereby widening the first recess;

add metal hard mask, to fill the widened first recess;

remove the ILD above the first S/D region and above the second S/D region, to yield a first trench above the first S/D region and a second trench above the second S/D region;

fill the first trench and the second trench with amorphous silicon;

recess the metal hard mask below a top of the spacer, to yield a second recess and to impart to the metal hard mask a second height less than the first height; and fill the second recess with a nitride.

502. The system of numbered section 501, wherein the semiconductor device processing system is further adapted to:

remove the amorphous silicon from the first trench and the second trench; and remove the CESL from the first S/D region, the second S/D region, and the spacer.

503. The system of numbered section 501, wherein the semiconductor device processing system is adapted to provide the metal hard mask as tungsten.

504. The system of numbered section 501, wherein the semiconductor device processing system is adapted to provide the gate as a high-k metal gate.

505. The system of numbered section 501, wherein the semiconductor device processing system is adapted to deposit the nitride as silicon nitride.

A method according to any of numbered sections 201-206 may be as depicted by FIGS. 1 and 15-23. A system according to any of numbered sections 301-306 may implement a process as depicted by FIGS. 1 and 15-23.

601. A semiconductor device, comprising:

a semiconductor substrate;

a gate disposed on the semiconductor substrate and having a first side and a second side;

a metal hard mask disposed on the gate and having a first side and second side, wherein the first side of the metal hard mask is vertically aligned with the first side of the gate and the second side of the metal hard mask is vertically aligned with the second side of the gate;

a nitride region disposed on the metal hard mask and having a first side and second side, wherein at least a portion of the first side of the nitride region is vertically aligned with the first sides of the gate and the metal hard mask, and at least a portion of the second side of the nitride region is vertically aligned with the second sides of the gate and the metal hard mask;

a spacer disposed on the first sides of the gate and the metal hard mask and on the second sides of the gate and the metal hard mask, wherein a top of the spacer is above a top of the metal hard mask;

a first source/drain (S/D) region disposed in proximity to the first side of the gate; and a second S/D region disposed in proximity to the second side of the gate.

602. The semiconductor device of numbered section 601, wherein the metal is tungsten.

603. The semiconductor device of numbered section 601, wherein the gate is a high-k metal gate.

604. The semiconductor device of numbered section 601, wherein the nitride is silicon nitride.

605. The semiconductor device of numbered section 601, wherein either:

the entire first side of the nitride region is vertically aligned with the first side of the gate and the first side of the metal hard mask;

the entire second side of the nitride region is vertically aligned with the second side of the gate and the second side of the metal hard mask; or both.

606. The semiconductor device of numbered section 601, wherein either:

the first side of the nitride region has a lower portion vertically aligned with the first side of the gate and the first side of the metal hard mask and an upper portion lacking vertical alignment with the first side of the gate and the first side of the metal hard mask;

the second side of the nitride region has a lower portion vertically aligned with the second side of the gate and the second side of the metal hard mask and an upper portion lacking vertical alignment with the second side of the gate and the second side of the metal hard mask; or both.

A device according to any of numbered sections 601-606 may be as depicted in one or more of FIGS. 7, 14, and 23.

What is claimed is:

1. A method, comprising:
   forming a gate disposed on a semiconductor substrate and having a first side and a second side;
   forming a metal hard mask disposed on the gate and having a first side and second side, wherein the first side of the metal hard mask is vertically aligned with the first side of the gate and the second side of the metal hard mask is vertically aligned with the second side of the gate;
   forming a nitride region disposed on the metal hard mask and having a first side and second side, wherein at least a portion of the first side of the nitride region is vertically aligned with the first sides of the gate and the metal hard mask, at least a portion of the second side of the nitride region is vertically aligned with the second sides of the gate and the metal hard mask; and the nitride region is T-shaped;
   forming a spacer disposed on the first sides of the gate and the metal hard mask and on the second sides of the gate and the metal hard mask, wherein a top of the spacer is above a top of the metal hard mask;
   forming a first source/drain (S/D) region disposed in proximity to the first side of the gate; and
   forming a second S/D region disposed in proximity to the second side of the gate.

2. The method of claim 1, wherein the metal is tungsten.

3. The method of claim 1, wherein the gate is a high-k metal gate.

4. The method of claim 1, wherein the nitride is silicon nitride.

5. The method of claim 1, wherein either:
   the entire first side of the nitride region is vertically aligned with the first side of the gate and the first side of the metal hard mask; or
   the entire second side of the nitride region is vertically aligned with the second side of the gate and the second side of the metal hard mask.

6. The method of claim 1, wherein either:
   the first side of the nitride region has a lower portion vertically aligned with the first side of the gate and the first side of the metal hard mask and an upper portion lacking vertical alignment with the first side of the gate and the first side of the metal hard mask;
   the second side of the nitride region has a lower portion vertically aligned with the second side of the gate and the second side of the metal hard mask and an upper portion lacking vertical alignment with the second side of the gate and the second side of the metal hard mask; or
   both.

7. A system, comprising:
   a semiconductor device processing system to manufacture a semiconductor device; and
   a processing controller operatively coupled to said semiconductor device processing system, said processing controller configured to control an operation of the semiconductor device processing system;
   wherein the semiconductor device processing system is adapted to:
   form a gate disposed on a semiconductor substrate and having a first side and a second side;
   form a metal hard mask disposed on the gate and having a first side and second side, wherein the first side of the metal hard mask is vertically aligned with the first side of the gate and the second side of the metal hard mask is vertically aligned with the second side of the gate;
   form a nitride region disposed on the metal hard mask and having a first side and second side, wherein a lower portion of the first side of the nitride region is vertically aligned with the first sides of the gate and the metal hard mask, a lower portion of the second side of the nitride region is vertically aligned with the second sides of the gate and the metal hard mask, and the nitride region is T-shaped;
   form a spacer disposed on the first sides of the gate and the metal hard mask and on the second sides of the gate and the metal hard mask, wherein a top of the spacer is above a top of the metal hard mask;
   form a first source/drain (S/D) region disposed in proximity to the first side of the gate; and
   form a second S/D region disposed in proximity to the second side of the gate.

8. The system of claim 7, wherein the semiconductor device processing system is adapted to provide the metal hard mask as tungsten.

9. The system of claim 7, wherein the semiconductor device processing system is adapted to provide the gate as a high-k metal gate.

10. The system of claim 7, wherein the semiconductor device processing system is adapted to deposit the nitride as silicon nitride.

11. The system of claim 7, wherein either:
    the entire first side of the nitride region is vertically aligned with the first side of the gate and the first side of the metal hard mask; or
    the entire second side of the nitride region is vertically aligned with the second side of the gate and the second side of the metal hard mask.

12. The system of claim 7, wherein either:
    the first side of the nitride region has a lower portion vertically aligned with the first side of the gate and the first side of the metal hard mask and an upper portion lacking vertical alignment with the first side of the gate and the first side of the metal hard mask;
    the second side of the nitride region has a lower portion vertically aligned with the second side of the gate and the second side of the metal hard mask and an upper portion lacking vertical alignment with the second side of the gate and the second side of the metal hard mask; or both.

13. A method, comprising:

providing a semiconductor structure comprising:
- a semiconductor substrate;
- a gate disposed on the semiconductor substrate and having a first side and a second side;
- a metal hard mask disposed on the gate and having a first side and second side, wherein the first side of the metal hard mask is vertically aligned with the first side of the gate and the second side of the metal hard mask is vertically aligned with the second side of the gate;
- a spacer disposed on the first sides of the gate and the metal hard mask and on the second sides of the gate and the metal hard mask;
- a first source/drain (S/D) region disposed in proximity to the first side of the gate;
- a second S/D region disposed in proximity to the second side of the gate;
- a contact etch stop layer (CESL) disposed on the first S/D region, the second S/D region, and on the spacer; and
- an interlayer dielectric (ILD) disposed on the CESL above the first S/D region and above the second S/D region;

removing the ILD above the first S/D region and above the second S/D region, to yield a first trench above the first S/D region and a second trench above the second S/D region;

filling the first trench and the second trench with amorphous silicon;

recessing the metal hard mask below a top of the spacer, to yield a recess; and filling the recess with a nitride.

14. The method of claim 13, further comprising:

removing the amorphous silicon from the first trench and the second trench; and removing the CESL from the first S/D region, the second S/D region, and the spacer.

15. The method of claim 13, wherein the metal is tungsten.

16. The method of claim 13, wherein the gate is a high-k metal gate.

17. The method of claim 13, wherein the nitride is silicon nitride.

* * * * *